United States Patent [19]

Frazier et al.

[11] Patent Number: 5,563,530
[45] Date of Patent: Oct. 8, 1996

[54] MULTI-FUNCTION RESONANT TUNNELING LOGIC GATE AND METHOD OF PERFORMING BINARY AND MULTI-VALUED LOGIC

[75] Inventors: Gary A. Frazier, Dallas; Alan C. Seabaugh, Richardson, both of Tex.

[73] Assignee: Texas Instruments Incorporated, Dallas, Tex.

[21] Appl. No.: 194,756

[22] Filed: Feb. 10, 1994

Related U.S. Application Data

[63] Continuation-in-part of Ser. No. 971,386, Nov. 4, 1992, abandoned.

[51] Int. Cl.[6] .................................................. H03K 19/08
[52] U.S. Cl. ......................... 326/132; 326/48; 326/49
[58] Field of Search .................................. 307/450, 443, 307/473, 458, 478; 326/131, 132, 48, 49

[56] References Cited

U.S. PATENT DOCUMENTS

| | | | |
|---|---|---|---|
| 4,047,199 | 9/1977 | Kataoka et al. | 307/445 |
| 4,849,799 | 7/1989 | Capasso et al. | 307/474 |
| 4,900,953 | 2/1990 | Watanabe | 307/450 |
| 4,956,681 | 9/1990 | Yokoyama et al. | 257/22 |
| 4,982,356 | 1/1991 | Ando | 364/773 |
| 5,151,618 | 9/1992 | Yokoyama et al. | 307/471 |
| 5,153,461 | 10/1992 | Takatsu | 307/478 |
| 5,233,205 | 8/1993 | Usagawa et al. | 307/450 |
| 5,313,117 | 5/1994 | Maezawa | 307/443 |

OTHER PUBLICATIONS

Chou et al., "Lateral Resonant Tunneling Transistors Employing Field-Induced Quantum Wells and Barriers"; Proceedings of the IEE; vol. 79, No. 8; pp. 1131–1139.

R. W. Lade; *Logic Combines Tunnel Diodes;* Electronics magazine; vol. 34, No. 9, Mar. 3, 1961, New York, US pp. 46–47.

*Primary Examiner*—Edward P. Westin
*Assistant Examiner*—Benjamin D. Driscoll
*Attorney, Agent, or Firm*—Carlton H. Hoel; W. James Brady, III; Richard L. Donaldson

[57] ABSTRACT

A multi-function resonant tunneling logic gate is provided in which a resonant tunneling transistor (12) includes a first terminal, a second terminal, and a third terminal. A plurality of signal inputs are coupled to the first terminal of the resonant tunneling transistor (12) through a summer (10). Furthermore, a biasing input is operable to apply a bias to the first terminal of resonant tunneling transistor (12) such that the transfer characteristic of the resonant tunneling transistor (12) can be shifted relative to the signal inputs.

25 Claims, 2 Drawing Sheets

MULTI-FUNCTION RESONANT TUNNELING LOGIC GATE AND METHOD OF PERFORMING BINARY AND MULTI-VALUED LOGIC

GOVERNMENT RIGHTS

The U.S. Government has a paid-up license in this invention and the right in limited circumstances to require the patent owner to license others on reasonable terms as provided for by the terms of Contract No. F33615-89-C-1074, Electronic Technology Laboratory, Wright Laboratory, Wright-Patterson AFB.

RELATED APPLICATIONS

This application is a continuation-in-part of coassigned application Ser. No. 07/971,386, filed Nov. 4, 1992 now abandoned.

TECHNICAL FIELD OF THE INVENTION

This invention relates generally to electronic circuits, and more particularly to a multi-function resonant tunneling logic gate and method of performing binary and multi-valued logic.

BACKGROUND OF THE INVENTION

With the advent of nanoelectronics, also called quantum effect electronics, device geometries can be downscaled to achieve significant increases in the functional density of integrated electronic systems. Improvements in functional density of up to an order of magnitude relative to conventional circuitry can be obtained through the use of the natural serpentine switching characteristic of quantum device. F. Capasso, S. Sen, F. Beltram, "Quantum-Effect Devices," High speed Semiconductor Devices. ed. by S. M. Sze, (John Wiley New York 1990) pp. 465–520. These devices display multiple on/off switching transitions as a function of their control inputs so that an entire logic function can be provided by a single switching component. These increases in functional density are particularly important for digital electronics, since there are limits to the scaleability of conventional transistors and wherein the need to increase the performance of integrated circuits is ever-pressing.

Additional increases in functional density can be obtained if arithmetic calculations can be performed in a higher logic radix than the traditional binary of radix-2 method. Conventional logic circuitry is based on 2-state or binary switching components. The pressure to reduce interconnection complexity and chip area provided early impetus to developing three-level (ternary) and n-level (n-ary) computing devices. Multivalued logic (MVL) circuits can also be used to compensate for faults within circuitry by using the extra levels to provide redundancy. Theoretically, average circuit wiring length and intricacy reduce with device radix. Gate count also tends to drop with increasing radix, since fewer devices are required to specify the state variables of the function. For example, ternary multipliers require fewer than 60% of the number of interconnections and 80% of the devices necessary in the equivalent binary configuration. Z. G. Vranesic and V. C. Hamacher, "Ternary Logic in Parallel Multipliers," Journal of Computation Vol. 15, No. 3, p. 2.54 (1972). Thus, multivalued technology has great potential for increasing circuit density and speed.

The lack of an adequate device technology has hampered the widespread development of MVL integrated circuits. To maintain noise immunity, it is essential that the transfer characteristic of MVL devices contain multiple plateaus of stable intermediate levels between power rails. Assuming the availability of circuit synthesis tools, the feasibility of the MVL approach depends critically upon the development of practical switching devices. Historical attempts to develop practical implementations of multivalued devices have not been successful. Early examples include the parametron, the Rutz transistor, and various ferrite loop devices. Ultimately, these approaches gave way to MVL circuits built up from binary devices that were arranged to exhibit a multivalued characteristic. But, conventional digital devices such as MOS transistors have a step-like switching characteristic that do not admit a natural multilevel operating mode. Multi-valued logic circuits use fewer logic gates and interconnections to perform the same arithmetic operations, thus saving circuit area and increasing the speed of calculations. Z. G. Vranesic and V. C. Hamacher, "Ternary Logic in Parallel Multipliers," Journal of Computation Vol. 15, No. 3, p. 254 (1972).

Therefore, the need has arisen for a quantum effect logic gate capable of performing complex logic functions within a single device. Furthermore, a need has arisen for such a quantum device that operates at room temperature and higher, and which can be electrically programmed to provide multiple logic operations in binary and multi-valued arithmetic circuits.

SUMMARY OF THE INVENTION

In accordance with the teachings of the present invention, a multi-function resonant tunneling logic gate and method of performing multi-function logic is provided which substantially enhances the capability associated with prior art implementations. In particular, a resonant tunneling transistor is provided with three terminals. The resonant tunneling transistor is characterized by a transfer characteristic. A plurality of signal inputs are coupled to the first terminal of the resonant tunneling transistor through a summer network. Furthermore, a biasing input is provided for applying a bias to the first terminal, such that the transfer function of the resonant tunneling transistor can be shifted relative to the signal inputs by changing the bias. This circuit can be used to perform many Boolean logical functions, including the NAND, the XNOR, the XOR, and the NOR functions. The transistor may comprise a bipolar resonant tunneling transistor or a field effect resonant tunneling transistor.

In a particular embodiment, the resonant tunneling transistor includes a single resonant tunneling diode in the third terminal. In another embodiment, the resonant tunneling transistor includes two or more resonance peaks.

An important technical advantage of the present invention is the fact that many Boolean logic functions may be performed with a single quantum effect device. Another important technical advantage of the present invention is the fact that many Boolean logic functions can be performed within a smaller integrated circuit area than existing systems. A still further technical advantage of the present invention is the fact that a quantum effect device can be adjusted to provide multi-valued logic operations.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 5b is a graph of the transfer characteristic of the circuit shown in FIG. 5a;

FIG. 6b is a graph illustrating the collector voltage versus base voltage of the circuit shown in FIG. 6a.

DETAILED DESCRIPTION OF THE INVENTION

Figure 1A:
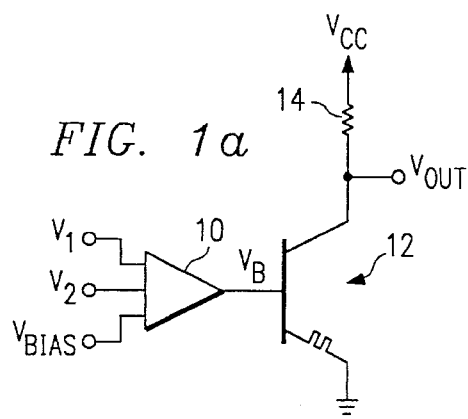
FIGS. 1a and 1b illustrate two-input multi-function resonant tunneling logic gates according to the present invention.

The preferred embodiments of the present invention are illustrated in FIGS. 1a through 7 of the drawings, like reference numerals being used to refer to like and corresponding pans of the various drawings.

FIG. 1a illustrates a multi-function resonant tunneling logic gate for two signal inputs constructed according to the teachings of the present invention. As shown in FIG. 1a, signal inputs $V_1$ and $V_2$, and $V_{BIAS}$ are input to a summer 10. The output of summer 10 is coupled to a resonant tunneling transistor indicated generally at 12.

Figure 1B:
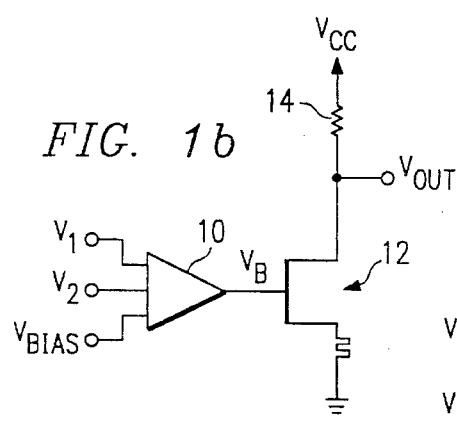

Transistor 12 is a three terminal device, having a first terminal, a second terminal, and a third terminal. As shown in FIG. 1a, transistor 12 may be a bipolar resonant tunneling transistor with a base, a collector, and an emitter. Alternatively, as shown in FIG. 1b, transistor 12 may be a field effect resonant tunneling transistor such as that disclosed in Chou, Allee, Pease, and Harris, "Lateral Resonant Tunneling Transistors Employing Field-Induced Quantum Wells and Barriers," Proceedings of the IEEE, Vol. 79, No. 8, August 1991, pp. 1131–39, or that disclosed in U.S. patent application Ser. No. 07/787,850, now U.S. Pat. No. 5,234,848, entitled "Lateral Resonant Tunneling Transistor with Heterojunction Barriers", filed Nov. 5, 1991 and assigned to Texas Instruments Incorporated. That patent is herein incorporated by reference. Such field effect transistors have at least one gate, a drain, and a source as the three terminals. For purposes of clarity, throughout this disclosure, reference will be made to bipolar resonant tunneling transistors, it being understood that field effect resonant tunneling transistors may also be used without departing from the intended scope herein.

The bipolar resonant tunneling transistor 12 may be of the type disclosed in U.S. patent application Ser. No. 07/567,847 entitled "Quantum Excited-State Tunneling Transistor with Resonant Tunneling Diode Injector and Process for Making Same", filed Aug. 15, 1990 and assigned to Texas Instruments Incorporated. That application is herein incorporated by reference. Furthermore, the resonant tunneling transistor can be of the types disclosed by Capasso, et al., "Quantum-Effect Devices," High speed Semiconductor Devices. ed. by S. M. Sze, (John Wiley New York 1990) pp. 465–520.

The output of summer 10 is coupled to the first terminal of transistor 12. Furthermore, the third terminal of transistor 12 is coupled to ground, and the second terminal is coupled to $V_{CC}$ through a resistor 14. The output from the logic gate shown in FIGS. 1a and 1b, $_{OUT}$ is taken from the collector of transistor 12.

Figure 2:
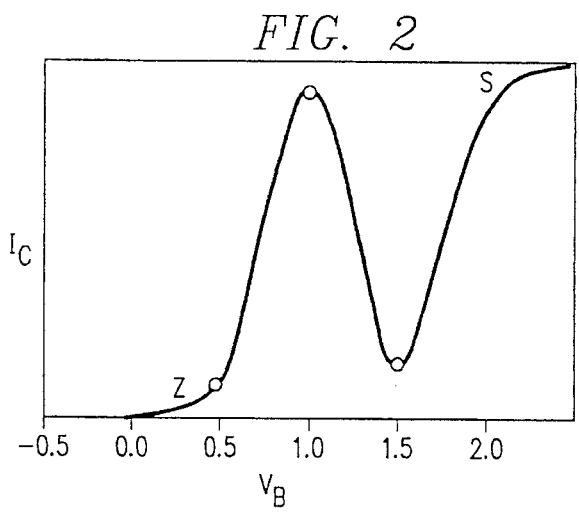
FIG. 2 is a graph of the transfer characteristic of the circuit shown in FIG. 1.

The operation of the circuit shown in FIG. 1a is best understood by reference to the graph shown in FIG. 2. FIG. 2 illustrates the transfer characteristic of the resonant tunneling transistor 12, with its characteristic transconductance peak resulting from the single resonant tunneling diode in the emitter (third terminal) of transistor 12. The voltage at the base (first terminal) of transistor 12 relative to ground is equal to the sum of $V_1$, $V_2$ and $V_{BIAS}$. As illustrated by the graph of FIG. 2, for base voltages below approximately one-half volts, transistor 12 is in the cut-off, or "Z", region. For base voltages above approximately two volts, transistor 12 is in saturation, or "S." Furthermore, the collector current of transistor 12 rises sharply as the base voltage rises from approximately one-half volts to one volt. Also, the collector current drops sharply as the base voltage rises from approximately one volt to one and one-half volts. The shape of this transfer characteristic can be used for digital logic functions.

With the transfer characteristics shown in FIG. 2, the output voltage will be low when the collector current is high, and high when the collector current is low. Because of the sharp rise and fall of the collector current, as illustrated in FIG. 2, digital functions may be realized by choosing the output at the collector of transistor 12.

In particular, the NAND, XNOR, XOR, and NOR functions can be realized by changing the voltage on the $V_{BIAS}$ input. In effect, changing the bias voltage shifts the transfer characteristic of the transistor 12 relative to the signal inputs such that different combinations of the signal inputs $V_1$ and $V_2$ result in different outputs. The following table, Table 1, illustrates how voltages on the $V_{BIAS}$ input signal between −1 and 2 volts change the logical output of the circuit shown in FIG. 1 by shifting the transfer characteristic.

TABLE 1

| Applied Volts | | | Logic | | |
|---|---|---|---|---|---|
| $V_{Bias}$ | $V_1$ | $V_2$ | $V_{out}$ | State | Function |
| 0.0 | 0.0 | 0.0 | High | 1 | NAND |
| 0.0 | 0.0 | 0.5 | High | 1 | |
| 0.0 | 0.5 | 0.0 | High | 1 | |
| 0.0 | 0.5 | 0.5 | Low | 0 | |
| 0.5 | 0.0 | 0.0 | High | 1 | XNOR |
| 0.5 | 0.0 | 0.5 | Low | 0 | |
| 0.5 | 0.5 | 0.0 | Low | 0 | |
| 0.5 | 0.5 | 0.5 | High | 1 | |
| 1.0 | 0.0 | 0.0 | Low | 0 | XOR |
| 1.0 | 0.0 | 0.5 | High | 1 | |
| 1.0 | 0.5 | 0.0 | High | 1 | |
| 1.0 | 0.5 | 0.5 | Low | 0 | |
| 1.5 | 0.0 | 0.0 | High | 1 | NOR |
| 1.5 | 0.0 | 0.5 | Low | 0 | |
| 1.5 | 0.5 | 0.0 | Low | 0 | |
| 1.5 | 0.5 | 0.5 | Low | 0 | |

Figure 3:
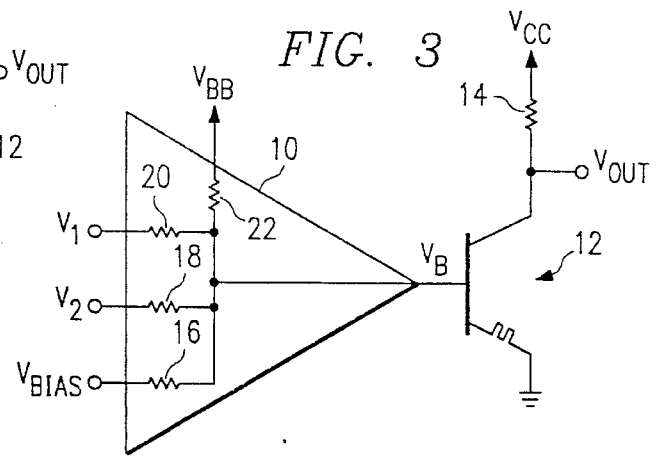
FIG. 3 is a circuit schematic illustrating the summer shown in FIG. 1.

FIG. 3 illustrates a circuit analogous to that of FIG. 1, with the summer 10 replaced by a resistor network which approximately sums and scales the input voltages at $V_1$, $V_2$, and $V_{BIAS}$ to yield output $V_B$. Indeed, when the resistances are large enough to make the current into the transistor base negligible with respect to the current in the resistors, then with resistors 16, 18, and 20 having equal resistances, and with the ratio of the resistance of resistor 22 to that of each of resistors 16, 18, and 20 denoted by R, $V_B$ is given by:

$$V_B = (V_1 + V_2 + V_{BIAS})R/(3R+1) + V_{BB}/(3R+1)$$

Thus with R large, $V_B$ approximately equals $(V_1+V_2+V_{BIAS})/3$. That is, the resistor network effectively sums the input voltages and scales by a factor of 3 to yield $V_B$. For example, resistors 16, 18, and 20 could each be one kiloohm, resistor 22 could be 50 kiloohms, and $V_{BB}$ could be five volts. In this case the results of Table 1 would directly apply provided that the resonant tunneling transistor 12 were dimensioned to have its first resonance at about 0.33 volt rather than 1.0 volt, its valley at 0.5 volt instead of at 1.5 volts, and its saturation at 0.67 volt rather than at 2.0 volts. Alternatively, the input voltages of Table 1 could be multiplied by a factor of 3, and the transistor 12 characteristics of FIG. 2 and the results of Table 1 both maintained. It should be understood that other summers can be used without departing from the intended scope of the present invention. Furthermore, the resistor values may be varied to weight the relative effect of each input signal on the output $V_{OUT}$.

Figure 4:
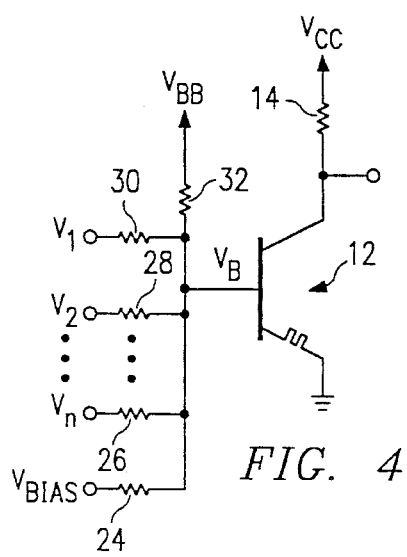
FIG. 4 is a circuit schematic of a generalized multi-function resonant tunneling logic gate constructed according to the teachings of the present invention.

FIG. 4 illustrates a generalized multi-function resonant tunneling logic gate according to the present invention. As shown in FIG. 4, the circuit illustrated is similar to that of FIG. 3 except that additional inputs are included. In particular, the circuit of FIG. 4 shows signal inputs $V_1$, $V_2$, through $V_n$ and $V_{BIAS}$. With this circuit, a set of n voltage sources may be used to drive a set of weighted resistors so as to control the circuit output. The transfer characteristic for this circuit is the same as shown in FIG. 2, but the base voltage $V_B$ is now derived from the signal inputs $V_1$ through $V_n$ and $V_{BIAS}$: with the resistance of resistor 32 much larger than that of each of equal resistors 24, 26, . . . 28, and 30, and with the base current negligible, $V_B$ is approximately equal to $((V_1+V_2+ \ldots +V_N+V_{BIAS})/(n+1))$.

As discussed above, a strong positive voltage on the $V_{BIAS}$ input tends to push the transfer characteristic of the resonant tunneling transistor 12 into saturation, while strong negative bias tends to hold transistor 12 in the zero collector current state. Adjustment of the weighting resistors or bias voltage allows the transistor 12 transfer characteristic to be programmed between these cut-off and saturation states. Between these extreme bias conditions, the voltage inputs to the device control the transistor 12 switch action to produce the equivalent of a Boolean logical NAND, XOR, XNOR, or NOR response.

Figure 5A:
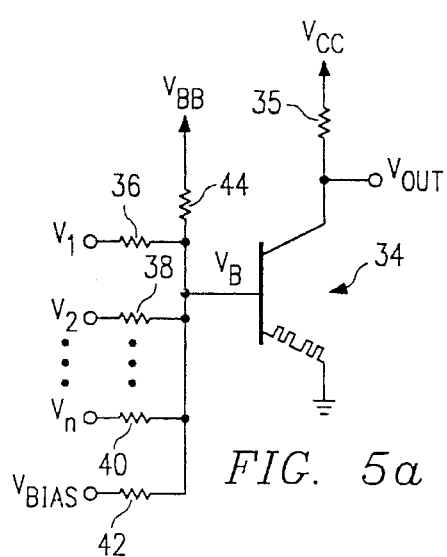
FIG. 5a is a circuit schematic of a multi-function resonant tunneling logic gate employing a resonant tunneling transistor with two resonant tunneling diodes.

FIG. 5a illustrates a generalized multi-function resonant tunneling logic gate according to the present invention that uses a resonant tunneling transistor with a serial chain of at least two resonant tunneling diodes in its emitter. The resonant tunneling transistor with two resonant tunneling diodes in the emitter is indicated generally at 34. Such a resonant tunneling transistor 34 has been disclosed by Capasso, Sen, Cho, and Sivco in "Multiple Negative Transconductance and Differential Conductance in a Bipolar Transistor by Sequential Quenching of Resonant Tunneling," Appl. Phys. Lett. 53 (12), pp. 1056–1058, Sep. 19, 1988. Alternatively, combinations of multiple quantum well resonant tunneling diodes can be used in the place of series resonant tunneling diodes in the transistor emitter to yield equivalent transfer function. Reference number 34 in FIG. 5 represents this embodiment as well. Such coupled multiple quantum well resonant tunneling diodes have been disclosed by Tanoue, Mizuta, and Takahashi, "A Triple Well Resonant Tunneling Diode for Multiple-Valued Logic Application", IEEE Electron Dev. Lett. 9 (8) pp. 365–367 August, 1988.

As shown in FIG. 5a, signal inputs $V_1$ through $V_n$ plus $V_{BIAS}$ input are summed and scaled by n+1 and coupled to the base of transistor 34. The summing network for this circuit may comprise a set of weighting resistors, generally known in the art. As shown in FIG. 5a, resistors 36, 38, 40, and 42 are the resistors through which $V_1$, $V_2$, $V_n$ and $V_{BIAS}$ are summed. Furthermore, the base of transistor 34 is coupled through resistor 44 to $V_{BB}$. These resistors may have a value on the order of one of kiloohm with resistor 44 having a much larger resistance, although other resistor values may be used to weight the input voltage signals and change the logic function of the circuit shown in FIG. 5a.

Figure 5B:
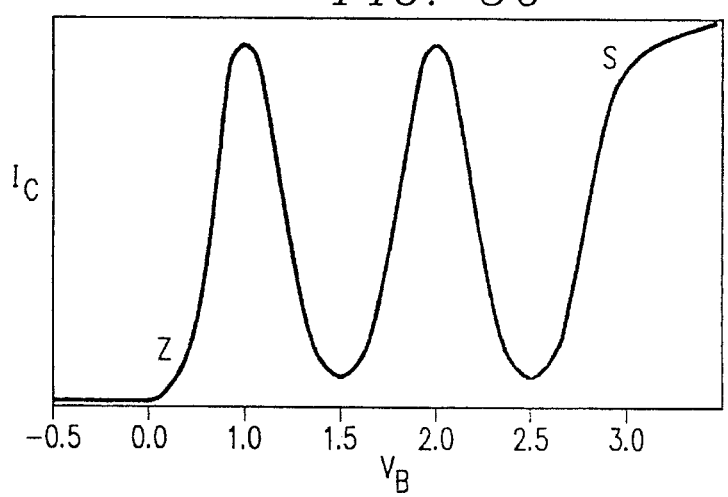

The operation of the circuit of FIG. 5a is best understood by reference to the graph of FIG. 5b, which illustrates its transfer characteristic. As shown in FIG. 5b, the transfer characteristic of the circuit shown in FIG. 5a is similar to that illustrated in FIG. 2, with the addition of an extra peak before the transistor 34 goes into saturation. As shown in FIGS. 5a and 5b, the current through resistor 35, which is coupled between the collector of transistor 34 and $V_{cc}$, rises sharply as the base voltage rises between one-half and one volt, one and one-half and two volts, and above two and one-half volts. Furthermore, the collector current decreases rapidly as the base voltage rises from one to one and one-half volts, and from two to two and one-half volts. Because of these sharp increases and decreases of the collector current of transistor 34, logic functions may be realized by taking the output voltage from the collector of transistor 34.

As discussed above, changing the bias voltage effectively moves the transfer characteristic relative to the signal inputs such that various logic functions may be achieved for various inputs. For example, the graph of FIG. 5b illustrates that if the bias voltage is one volt, then an output low will be achieved at $V_{OUT}$ if all other input voltages are zero volts. In this case, transistor 34 would be "on" and the voltage at $V_{OUT}$, or the collector voltage of transistor 34, would be a low logic level voltage.

The extra peak introduced into the transfer characteristic by the second resonant tunneling diode of transistor 34 allows for more complex logic functions to be achieved. These complex logic functions may be achieved, as discussed above, by changing the voltage on the $V_{BIAS}$ input and by changing the resistor values of the resistors through which the input voltage signals are coupled to the base of transistor 34. Changing these resistor values has the effect of weighting the various inputs. Thus, the logic function realized by the circuit of FIG. 5a is a function of the bias voltage on the $V_{BIAS}$ and the weighted sum of the other input voltages.

Figure 6A:
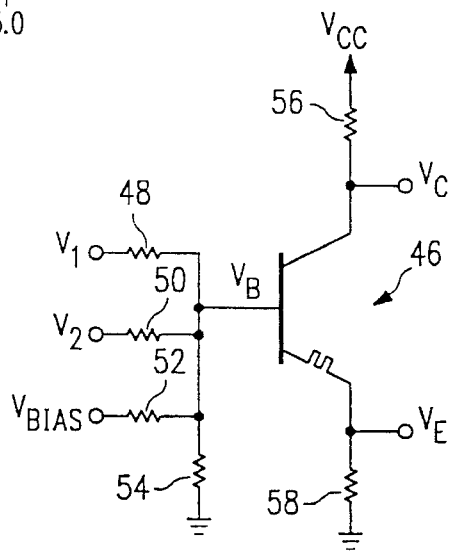
FIG. 6a is a circuit schematic illustrating a multi-function resonant tunneling logic gate for multi-valued logic circuits.

FIG. 6a illustrates a circuit according to the present invention for use in multi-valued logic systems. As shown in FIG. 6a, input voltage signals $V_1$ and $V_2$ along with bias input $V_{BIAS}$ are input to the base of resonant tunneling transistor 46. In the embodiment shown, resonant tunneling transistor 46 has a single resonant tunneling diode in its emitter. It should be understood that other resonant tunneling transistors, such as that discussed in FIGS. 5a and 5b, may also be used without departing from the intended scope herein. Furthermore, two inputs are illustrated for clarity. A plurality of inputs may be used without departing from the intended scope of the present invention.

$V_1$ is input to the base of transistor 46 through weighting resistor 48. Input voltage $V_2$ is input to the base of transistor 46 through weighting resistor 50. Likewise, bias voltage $V_{BIAS}$ is input to the base of transistor 46 through weighting resistor 52. The base of transistor 46 is also coupled to ground through resistor 54. These resistors may have values of one kiloohm each except resistor 54 would be much larger, although other resistor values may be used to perform different logic functions by weighting the voltage inputs. The collector of transistor 46 is coupled to $V_{cc}$ through resistor 56. The emitter of transistor 46 is coupled to ground through resistor 58. As with the network of FIG. 3, $V_B$ approximately equals $(V_1+V_2+V_{BIAS})/3$ for the circuit of FIG. 6a.

Figure 6B:
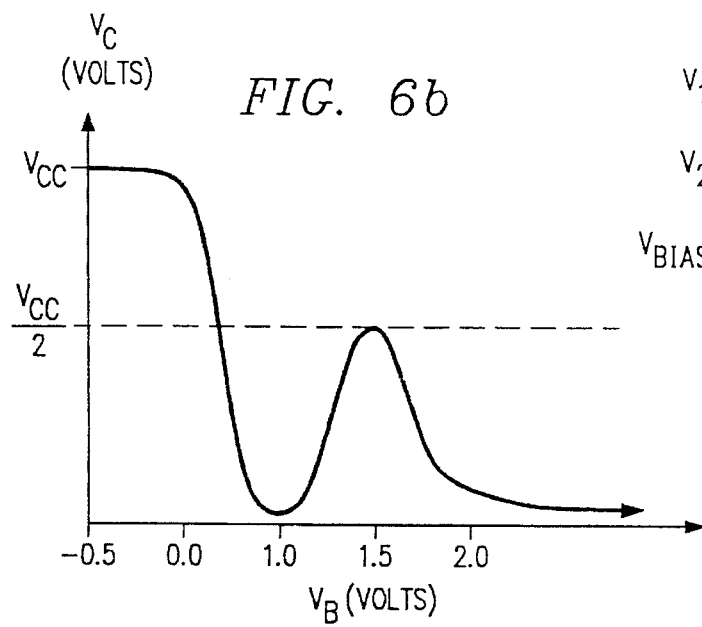

The operation of the circuit shown in FIG. 6a is best understood by reference to the graph of the collector voltage versus base voltage shown in FIG. 6b. As shown in FIG. 6b, the collector voltage of transistor 46 is equal to $V_{cc}$ until transistor 46 turns on. Transistor 46 begins to turn on as the base voltage rises from one-half to one volt, and the collector voltage falls toward zero volts. As the base voltage rises from one to one and one-half volts, the collector current decreases and the voltage of the collector rises to a peak of about $V_{cc}/2$. As the base voltage rises above two volts, transistor 46 begins to saturate and the collector voltage drops to near zero volts.

The height of the peak of the curve shown in FIG. 6b is a function of the current limit through the resonant tunneling transistor 46 and the value of resistors 56 and 58. FIG. 6b illustrates the case where these are adjusted such that the peak is equal to $V_{cc}/2$. This peak can be adjusted to match other voltage levels, as may be needed for other multi-level voltage systems. The current limit through the transistor 46 is also a function of the current limit through the resonant tunneling diodes in the emitter of transistor 46 as well as the gain of the transistor 46; under certain conditions resistor 58 can be removed. Thus, it should be understood that the discussions of the circuit of FIG. 6a and the circuits to be discussed below are for purposes of teaching the present invention, and other voltage levels may be used without departing from the intended scope of the present invention.

The transfer characteristic illustrated in FIG. 6b reveals that the circuit shown in FIG. 6a can be used for multi-valued logic systems, since three distinct voltage states are achievable. For the particular embodiment shown in FIG. 6a and 6b, these three states are approximately $V_{cc}$, zero volts, and $V_{cc}/2$. Furthermore, the transfer characteristic can be shifted relative to the signal inputs by changing the bias voltage.

With $V_{BIAS}$ equal to 1.5 volts, the following table, Table 2, illustrates the three-value logic function achieved by the circuit of FIG. 6a, with the output taken at the collector of transistor 46.

TABLE 2

| $V_2$ | $V_1$ | | |
|---|---|---|---|
| | 0 | 1 | 2 |
| 0 | 2 | 0 | 1 |
| 1 | 0 | 1 | 0 |
| 2 | 1 | 0 | 0 |

As shown in Table 2, a "2" output represents a high logic level, "1" represents a medium logic level, and "0" represents a low logic level. As discussed above, for the particular embodiment shown, these logic values are approximately $V_{cc}$, $V_{cc}/2$, and zero volts, respectively. As discussed in connection with Table 1 and FIG. 3, the "0" for the input $V_1$ and $V_2$ is 0 volts, the "1" is 1.5 volts (three times the 0.5 volt increments needed for $V_B$), and the "2" is 3.0 volts. That is, the input levels are in terms of multiples of 1.5 volts. Again, the factor of three compensates for the particular resistor network used in FIG. 6a.

For a $V_{BIAS}$ equal to 0 volts and the multiples of 1.5 volts input levels as in Table 2, the following table, Table 3, illustrates the logic function realized by the circuit of FIG. 6a, with the output taken at the collector of transistor 46.

TABLE 3

| $V_1$ | $V_2$ | | |
|---|---|---|---|
| | 0 | 1 | 2 |
| 0 | 2 | 2 | 0 |
| 1 | 2 | 0 | 1 |
| 2 | 0 | 1 | 0 |

The circuit of FIG. 6a can also be used to implement a cycle gate circuit. For this particular embodiment, $V_{BIAS}$ plus $V_2$ equals 1.5 volts. With this implementation, the following table, Table 4, illustrates the troth-table for the cycle gate circuit, with the output taken at the collector of transistor 46. As can be seen from Table 4, the $V_1$ (again expressed in multiples of 1.5 volts) to $V_c$ logic states of 0 to 2, 1 to 0, and 2 to 1 provide ternary cycle operation.

TABLE 4

| $V_1$ | $V_c$ | Logic State |
|---|---|---|
| −1 | $V_{cc}$ | 2 |
| 0 | $V_{cc}$ | 2 |
| 1 | 0 | 0 |
| 2 | $V_{cc}/2$ | 1 |
| 3 | 0 | 0 |
| 4 | 0 | 0 |

As another example, a common collector shuffle gate circuit can be implemented with the circuit shown in FIG. 6a. In this example, $V_2$ plus $V_{BIAS}$ equal 1.5 volts, and resistor 56 is equal to zero ohms. Furthermore, the output of the common collector shuffle gate circuit is taken at the emitter $V_E$ of transistor 46. The troth-table for this shuffle gate is shown in Table 5 below.

TABLE 5

| $V_1$ | $V_{out}$ |
|---|---|
| 0 | 0 |
| 1 | 2 |
| 2 | 1 |

Figure 7:
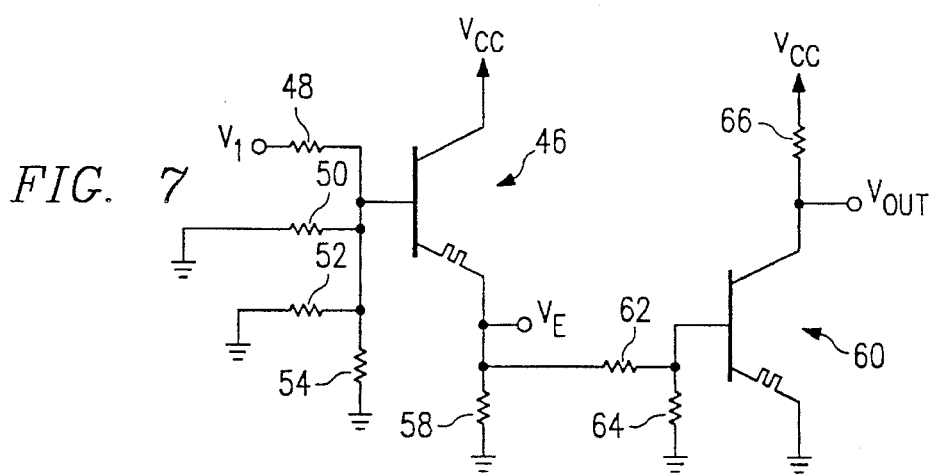
FIG. 7 is a circuit schematic illustrating a three-valued inverter circuit constructed according to the teachings of the present invention.

FIG. 7 illustrates a three-value logic inverter circuit. As shown in FIG. 7, this circuit involves coupling the circuit of FIG. 6a to a resonant tunneling transistor 60. In particular, the emitter of transistor 46 is coupled to the base of transistor 60 through a resistor 62. Furthermore, the base of transistor 60 is coupled to ground through a resistor 64. The collector of transistor 60 is coupled to $V_{cc}$ through a resistor 66. The output of the three-valued inverter circuit is taken from the collector of transistor 60. The truth-table for the circuit shown in FIG. 7 is illustrated in Table 6 below.

TABLE 6

| $V_1$ | $V_{out}$ |
|---|---|
| 0 | 2 |
| 1 | 1 |
| 2 | 0 |

As shown in FIG. 7, the inverter circuit comprises a shuffle circuit coupled to a cycle gate circuit. Thus, the output of the shuffle circuit, as characterized by the truth-table of Table 5, is input to a cycle gate circuit, the truth-table for which is shown in Table 4.

It should be understood that other summing networks may be used to sum the various input voltages into the base of the resonant tunneling transistors used in the described circuits without departing from the intended scope of the present invention. Furthermore, the particular voltages and currents used to characterize the operation of the resonant tunneling transistors of the present invention, such as those used in connection with FIGS. 2, 5b, and 6b, are exemplary, and other resonant tunneling transistors with different characteristic voltages and currents may be used without departing from the intended scope herein.

Although the present invention has been described in detail, it should be understood that various changes, substitutions, and alterations can be made without departing from the spirit and scope of the invention, as defined solely by the appended claims.

What is claimed is:

1. A multi-function resonant tunneling logic gate, comprising:

a resonant tunneling transistor having a first terminal, a second terminal, and a third terminal, said resonant tunneling transistor with a transfer characteristic;

a summer coupled to said first terminal;

a plurality of logic inputs coupled to said summer; and a biasing input coupled to apply a bias to said first terminal, wherein said transfer characteristic can be shifted relative to said logic inputs by changing said bias at said biasing input.

2. The logic gate of claim 1, wherein said resonant tunneling transistor comprises a bipolar resonant tunneling transistor, and wherein said first, second, and third terminals comprise a base, collector, and emitter, respectively.

3. The logic gate of claim 1, wherein said resonant tunneling transistor comprises a field effect resonant tunneling transistor, and wherein said first, second, and third terminals comprise a gate, drain, and source, respectively.

4. The logic gate of claim 1, wherein said resonant tunneling transistor includes a single resonant tunneling diode in said emitter.

5. The logic gate of claim 1, wherein said resonant tunneling transistor includes a plurality of resonant tunneling diodes in said emitter.

6. The logic gate of claim 1, wherein said resonant tunneling transistor includes any multiple-peak resonant tunneling transfer characteristic obtained by coupled quantum wells.

7. The logic gate of claim 1, wherein said bias is set such that said logic gate performs a logical NAND function.

8. The logic gate of claim 1, wherein said bias is set such that said logic gate performs a logical XNOR function.

9. The logic gate of claim 1, wherein said bias is set such that said logic gate performs a logical XOR function.

10. The logic gate of claim 1, wherein said bias is set such that said logic gate performs a logical NOR function.

11. The logic gate of claim 1, wherein said summer weights and sums signals at said logic inputs.

12. A multi-function resonant tunneling logic gate for use in multi-value logic systems, comprising:

a first resonant tunneling transistor having a first terminal, a second terminal, and a third terminal, said first resonant tunneling transistor characterized by a transfer characteristic;

current limiting circuitry operable to limit current through said first resonant tunneling transistor such that a plurality of voltage levels can be output from said first resonant tunneling transistor;

a summer coupled to said first terminal;

a plurality of signal inputs coupled to said summer; and a biasing input operable to apply a bias to said first terminal, such that said transfer characteristic can be shifted relative to said signal inputs by changing said bias on said biasing input.

13. The logic gate of claim 12, wherein said resonant tunneling transistor comprises a bipolar resonant tunneling transistor, and wherein said first, second, and third terminals comprise a base, collector, and emitter, respectively.

14. The logic gate of claim 12, wherein said resonant tunneling transistor comprises a field effect resonant tunneling transistor, and wherein said first, second, and third terminals comprise a gate, drain, and source, respectively.

15. The logic gate of claim 12, wherein said current limiting circuitry comprises a resistor coupled between said second terminal and a voltage source.

16. The logic gate of claim 15, wherein all but one of said signal inputs are coupled to ground, and said bias is zero, such that a cycle logic function on the one signal input not coupled to ground is output at said second terminal.

17. The logic gate of claim 12, wherein said current limiting circuitry comprises a resistor coupled between said third terminal and ground.

18. The logic gate of claim 17, wherein all but one of said signal inputs are coupled to ground, and said bias is zero, such that a shuffle logic function on the one signal input not coupled to ground is output at said third terminal.

19. The logic gate of claim 12, wherein said current limiting circuitry comprises a resistor coupled between said third terminal and ground, and wherein all but one of said signal inputs are coupled to ground, and said bias is zero, and further comprising:

a second resonant tunneling transistor having a fourth terminal, a fifth terminal, and a sixth terminal, said fourth terminal coupled to said third terminal, such that a ternary inverter logic function on the one signal input not coupled to ground is output at said fifth terminal.

20. A method of performing multi-function logic, comprising the steps of:

summing a plurality of signal inputs:

inputting the summed signal inputs to a resonant tunneling transistor having a first terminal, a second terminal, and a third terminal, the resonant tunneling transistor characterized by a transfer characteristic;

biasing the first terminal of the resonant tunneling transistor, such that the transfer characteristic can be shifted relative to the signal inputs by changing the bias.

21. The method of claim 20, wherein said step of biasing comprises biasing the first terminal such that a logical NAND function is performed on the signal inputs.

22. The method of claim 20, wherein said step of biasing comprises biasing the first terminal such that a logical XNOR function is performed on the signal inputs.

23. The method of claim 20, wherein said step of biasing comprises biasing the first terminal such that a logical XOR function is performed on the signal inputs.

24. The method of claim 20, wherein said step of biasing comprises biasing the first terminal such that a logical NOR function is performed on the signal inputs.

25. The method of claim 20, and further comprising the step of limiting the current through the resonant tunneling transistor, such that a plurality of voltage levels can be output from the resonant tunneling transistor.

* * * * *